United States Patent [19]

Lee et al.

[11] Patent Number: 5,712,207
[45] Date of Patent: Jan. 27, 1998

[54] PROFILE IMPROVEMENT OF A METAL INTERCONNECT STRUCTURE ON A TUNGSTEN PLUG

[75] Inventors: Chung-Kuang Lee; Pi-Chen Shieh; Pin-Nan Tseng, all of Hsin-chu, Taiwan

[73] Assignee: Taiwan Semiconductor Manufacturing Company, Ltd., Hsin-Chu, Taiwan

[21] Appl. No.: 858,289

[22] Filed: May 19, 1997

Related U.S. Application Data

[63] Continuation of Ser. No. 608,791, Feb. 29, 1996, abandoned.
[51] Int. Cl.$^6$ .................................................. H01L 21/29
[52] U.S. Cl. .......................... 438/627; 438/628; 438/629; 438/643; 438/648; 438/660; 438/661; 438/670
[58] Field of Search ........................... 438/643, 648, 438/660, 661, 672, 627, 629, 628

[56] References Cited

U.S. PATENT DOCUMENTS

| 5,219,790 | 6/1993 | Miyatake | 437/188 |
|---|---|---|---|
| 5,308,792 | 5/1994 | Okabayashi et al. | 437/192 |
| 5,332,691 | 7/1994 | Kinoshita et al. | 437/192 |
| 5,407,861 | 4/1995 | Marangnon et al. | 438/672 |
| 5,422,310 | 6/1995 | Ito | 437/192 |
| 5,527,736 | 6/1996 | Huang et al. | 438/672 |
| 5,529,955 | 6/1996 | Hibino et al. | 438/672 |
| 5,552,340 | 9/1996 | Lee et al. | 437/192 |

OTHER PUBLICATIONS

Mizobuchi et al, "Application of force fill Al–plug technology to 64 Mb DRAM and 0.35 mum logic", 1995 Symposium on VLSI Technology, Digest of Technical Papers, Kyoto, Japan, Jun. 6–8, 1995.

Dixit et al, "A novel high pressure low temperature aluminum plug technology for sub 0.5 mu m contact/via geometries", International Electron Devices Meeting 1994, San Francisco, CA, Dec. 11–14, 1994.

S. Wolf, "Silicon Processing for the VLSI Era, vol. 1", Lattice Press 1986, pp. 184–185.

Z. Shterenfeld-Lavie et al, "A 3–Level, 0.35 micron interconnection process using an innovative, high pressure aluminum plug technology", 1995 VMIC Conference, Jun. 27–29, pp. 31–37, Jun. 1995.

*Primary Examiner*—John Niebling
*Assistant Examiner*—Thomas G. Bilodeau
*Attorney, Agent, or Firm*—George O. Saile; Stephen B. Ackerman

[57] ABSTRACT

A process for forming aluminum interconnect structures has been developed, that concentrates on alleviating the effects of the poor step coverage of the interconnect metallization, that develops in areas where aluminum overlies tungsten filled contact holes. A high pressure treatment of the aluminum based metallization layer is performed at pressures in the range of 50 to 120 Mega-pascal, to improve the coverage of the aluminum based layer, specifically in seams or voids in the underlying tungsten plugs.

18 Claims, 3 Drawing Sheets

PROFILE IMPROVEMENT OF A METAL INTERCONNECT STRUCTURE ON A TUNGSTEN PLUG

This application is a continuation of application 08/608,791, filed Feb. 29, 1996, now abandoned

BACKGROUND OF THE INVENTION

(1) Field of the Invention

This invention relates to methods used to fabricate semiconductor devices, and more specifically to a process for forming metal interconnect structures.

(2) Description of Prior Art

The semiconductor industry continually investigates methods for improving the performance of specific devices or silicon chips, while still maintaining, or reducing the manufacturing cost of these silicon chips. The trend to micro-miniaturazation, or the ability to fabricate silicon chips, with sub-micron features, has allowed the performance, as well as the cost objectives to be in part, realized. Silicon devices, fabricated with sub-micron features, have resulted in capacitance and resistance decreases, thus improving device performance. In addition the use of sub-micron features, has allowed levels of integration, normally obtained with larger chips, to be realized with smaller chip sizes. The use of smaller silicon chips results in a cost reduction, resulting from a greater amount of chips obtained from a specific size silicon substrate.

The ability to produce sub-micron features has been accomplished by advances in specific semiconductor fabrication disciplines, such as photolithography and reactive ion etching, (RIE). The use of more sophisticated exposure cameras, as well as the use of more sensitive photoresist materials, have allowed sub-micron images to be routinely formed in photoresist materials. In addition the development of selective, anisotropic, dry etching, equipment and processes, has allowed these sub-micron images in photoresist layers, to be successfully transferred to underlying materials, used for the fabrication of advanced silicon devices. However with the use of sub-micron features, difficulties are encountered with specific semiconductor fabrication processes, that were not present for counterparts fabricated using larger device features. For example, metal filled via, or contact holes, used to connect conductive layers, become more difficult to fill with a metal, as the diameter of the contact or via hole opening approaches sub-micron dimensions. The use of aluminum to fill these small holes is limited by the inadequate step coverage of aluminum deposition processes, such as sputtering or evaporation. In addition the current carrying capabilities of aluminum based metallizations may not be sufficient to withstand the higher current densities encountered with the use of sub-micron contact or via holes, and thus reliability concerns, in the form of electromigration, may exist. Therefore to satisfy the increased current density, the semiconductor industry has turned to the use of tungsten as a contact or via fill.

The use of tungsten, to fill contact holes with sub-micron dimensions, has been accomplished via the use of low pressure chemical vapor deposition, (LPCVD), processes. This deposition technique demonstrates improved step coverage for small contact holes, when compared to counterparts filled with materials obtained via the use of evaporated or sputtered processes. However even with the use of LPCVD tungsten processes, for filling sub-micron contact holes, specific problems are still present. The tungsten fill process, using LPCVD, proceeds by the mechanism of the depositing metal, coating the sides of the contact hole. At a specific point, where the metal coated sides converge, a seam or dimple can evolve. Subsequent processing, such as dry etching used to remove unwanted metal, tungsten in this case, from areas outside the contact hole, can aggravate the tungsten seam and create a larger seam or a void in the tungsten fill. This void now offers a severe topology for subsequent interconnect metallizations to contend with. Thinning of the interconnect metallization layer, in the area of the void, can create serious yield and reliability problems. Therefore the semiconductor industry has offered numerous solutions for alleviating the tungsten seam or dimple, created via the use of LPCVD tungsten fills. Ito, in U.S. Pat. No. 5,422,310, suggests processes which optimize the tungsten residual removal stage, thus reducing the exposure of the tungsten seam to dry etching procedures. Kinoshita, et al, in U.S. Pat. No. 5,332, 691, offer a tungsten deposition process that minimizes the seam formation. This invention will not concentrate on the tungsten seam or void, but will offer a process that results in an overlying aluminum based metallization structure, successfully filling the void created by the tungsten fill.

SUMMARY OF THE INVENTION

It is an object of this invention to fabricate tungsten filled, high aspect ratio, small diameter, contact holes.

It is another object of this invention to fabricate a aluminum based, interconnect structure, overlying the tungsten filled, contact hole.

It is still another object of this invention to subject the aluminum based, interconnect structure to a high pressure treatment to improve the coverage of the aluminum based, interconnect structure, in areas where it interfaced a seam, or a void in the underlying tungsten fill.

In accordance with the present invention a method is described for creating an aluminum based, interconnect structure, overlying a tungsten filled contact hole, in which the coverage of the aluminum based, interconnect structure, in areas overlying a tungsten seam, is improved via a high pressure treatment. A small diameter contact hole, is opened in a dielectric layer, to an active device region in a semiconductor substrate. A layer of titanium, to be used for adhesion and contact purposes, and a layer of titanium nitride, to be used as a barrier to protect underlying materials from being attacked by subsequent process reactants, are deposited. A layer of LPCVD tungsten is used to completely fill the small diameter contact hole. Selective, RIE processing is performed to remove unwanted tungsten from regions outside the contact hole, creating a tungsten plug in the small diameter contact hole. An aluminum based, interconnect structure, overlying the tungsten plug, is formed via deposition and patterning procedures. A high pressure, extrusion procedure is performed to the aluminum based, interconnect structure, to improve the profile of the aluminum based, interconnect structure, in areas where it overlaid a seam or void in the tungsten filled small diameter contact hole.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method for creating high pressure treated, aluminum based, interconnect structures, exhibiting improved conformality to underlying tungsten filled contact holes, will now be described. This invention can be used for fabricating metal interconnects for metal oxide semiconductor field effect transistors, (MOSFET), devices, that are currently being manufactured in industry, therefore only the specific areas, unique to understanding this invention, will be covered in detail.

Figure 1:
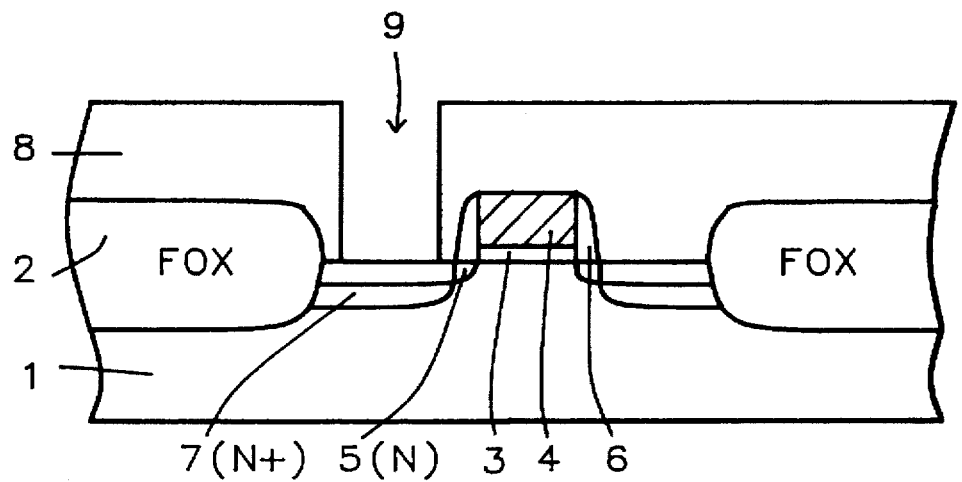
FIG. 1, which schematically, in cross-sectional style, represents a silicon device, at a stage prior to tungsten fill of small diameter contact holes.

FIG. 1, schematically shows an N channel, (NFET), device, that this invention, of an optimized aluminum interconnect structure profile, can be applied to. A P type, single crystalline, silicon substrate, 1 with a <100> crystallographic orientation, is used. Thick field oxide regions, 2, (FOX), are formed for purposes of device isolation. The FOX regions, of silicon dioxide, are formed by initially patterning a silicon nitride—silicon dioxide composite insulator, using conventional photolithographic and dry etching procedures. After photoresist removal, via oxygen plasma ashing, followed by careful wet cleans, the FOX regions, 2, are produced in silicon areas not covered by the oxidation masking composite insulator, by thermal oxidation in an oxygen steam ambient, at a temperature between about 850° to 1050° C., to a thickness between about 4000 to 6000 Angstroms. After removal of the oxidation masking composite insulator, using hot phosphoric acid for the silicon nitride layer, and a buffered hydrofluoric acid solution for the underlying silicon dioxide layer, a thin, silicon dioxide, gate insulator, 3, is grown at a temperature between about 800° to 1000° C., to a thickness between about 50 to 300 Angstroms, in an oxygen steam ambient. A polysilicon layer is next deposited using LPCVD processing, at a temperature between about 500° to 700° C., to a thickness between about 2000 to 4000 Angstroms. The polysilicon can be grown intrinsically and doped via ion implantation of either arsenic or phosphorous, at an energy between 50 to 100 Kev., at a dose between about 1E15 to 1E16 atoms/cm². Another alternative is to grow the polysilicon layer using LPCVD, insitu doping processing, via incorporation of the desired amount of either arsine or phosphine being added to the silane decomposition process. Conventional photolithographic and RIE processing, using $Cl_2$ as an etchant, are used to form polysilicon gate structure, 4, shown in FIG. 1.

Following photoresist removal, via oxygen plasma ashing and careful wet cleans, an ion implantation of phosphorous is performed at an energy between about 30 to 60 Kev., at a dose between about 1 E12 to 5 E13 atoms/cm², to create N type, lightly doped source and drain region, 5. A silicon oxide layer is next deposited using either LPCVD or plasma enhanced chemical vapor deposition, (PECVD), processing, at a temperature between about 400° to 800° C., to a thickness between about 1500 to 4000 Angstroms, using tetraethylorthosilicate as a source. Anisotropic, selective, RIE procedures, using $CHF_3$ as an etchant, are employed to create insulator sidewall spacer, 6, shown in FIG. 1. A heavily doped, N+ source and drain region, 7, is next created via an arsenic ion implantation procedure, at an energy between about 50 to 100 Kev., at a dose between about 1E14 to 5E15 atoms/cm².

An layer of silicon oxide, 8, is deposited using either LPCVD, PECVD, or atmospheric pressure chemical vapor deposition, (APCVD), processing, at a temperature between about 400° to 800° C., to a thickness between about 5000 to 10000 Angstroms. A contact hole, 9, is formed in silicon oxide layer, 8, via standard photolithographic and RIE procedures, using $CHF_3$ as an etchant. Photoresist removal is again accomplished via oxygen plasma ashing, followed by careful wet cleans. This is shown schematically in FIG. 1. The trend to micro-miniaturazation has led to designs in which contact holes, such as contact hole, 9, are being fabricated with large aspect ratios. The aspect ratio, or the depth of the contact hole, divided by the diameter of the contact hole opening, is greater then aspect ratios encountered with less aggressive designs. Contact hole, 9, shown in FIG. 1, has a opening with a diameter between about 0.3 to 0.8 µM, and coupled with the depth of contact hole, 9, results in an aspect ratio between about 1 to 3. These large aspect ratio contact holes are difficult to adequately fill with metal, and the lack of adequate metal fill can ultimately result in either yield and reliability problems.

Figure 2:
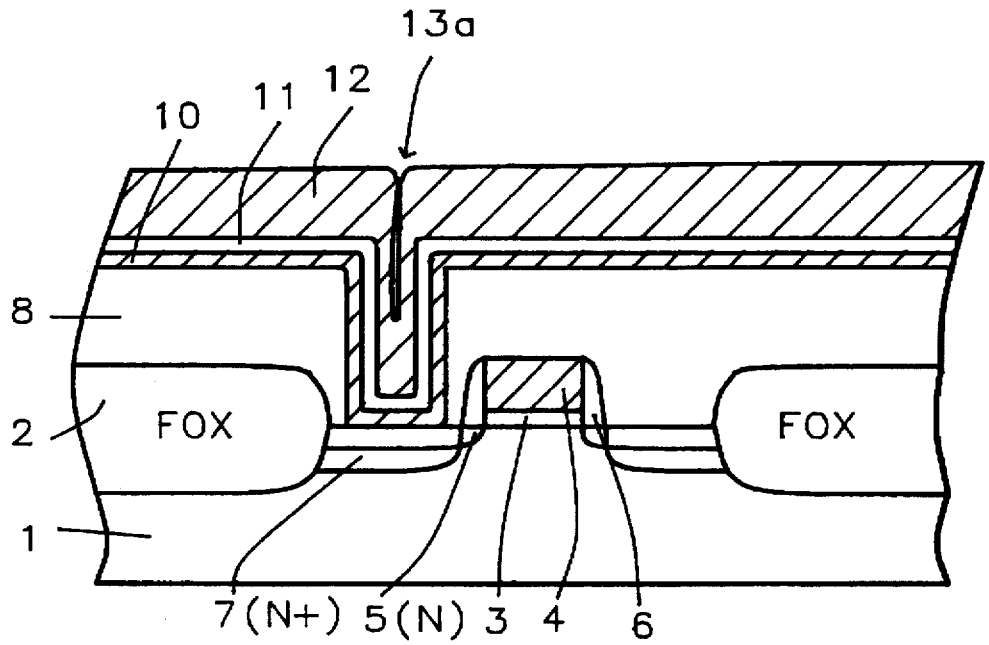
FIG. 2, which schematically, in cross-sectional style, represents a small diameter contact hole, filled with LPCVD tungsten, with a seam in the tungsten fill.

The process of filling contact hole, 9, is shown schematically in FIG. 2, and initiates with a buffered hydrofluoric preclean of the exposed, N+, heavily doped, source and drain region, 7. Next a layer of titanium, 10, is deposited, using r.f. sputtering, to a thickness between about 200 to 500 Angstroms. This layer is employed to provide adhesion to underlying insulator layers, as well as providing ohmic contact to underlying silicon device regions. Next a layer of titanium nitride, 11, is deposited, again via the use of r.f. sputtering, to a thickness between about 500 to 1500 Angstroms. Subsequent tungsten depositions, via the decomposition of tungsten hexafluoride, can produce by-products that can attack exposed silicon or titanium regions, however the titanium nitride layer, 11, serves as a barrier against this attack. Finally a tungsten layer, 12, is deposited using LPCVD processing at a temperature between about 300° to 500° C., to a thickness between about 2000 to 8000 Angstroms. The tungsten fills contact hole, 9, by depositing on the sides of the contact hole, and thus at the point where the tungsten layers meet, a seam, 13a, is created. The severity of seam, 13a, is mainly function of the large aspect ratio of contact hole, 9.

Figure 3:
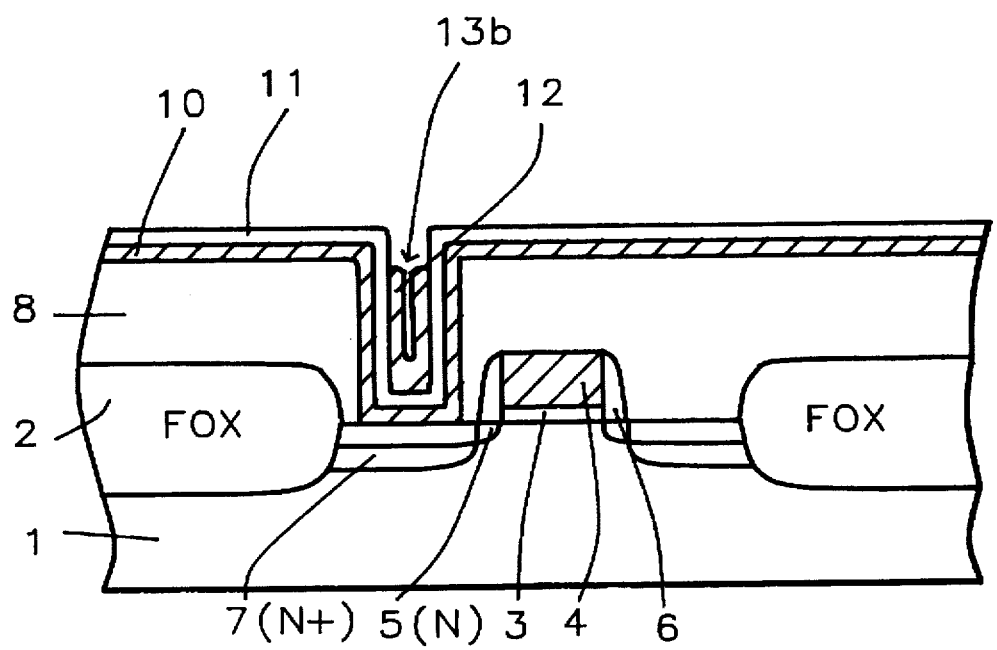
FIG. 3, which schematically, in cross-sectional style, shows an enlarged seam in the tungsten fill, due to dry etching procedures.
Figure 4:
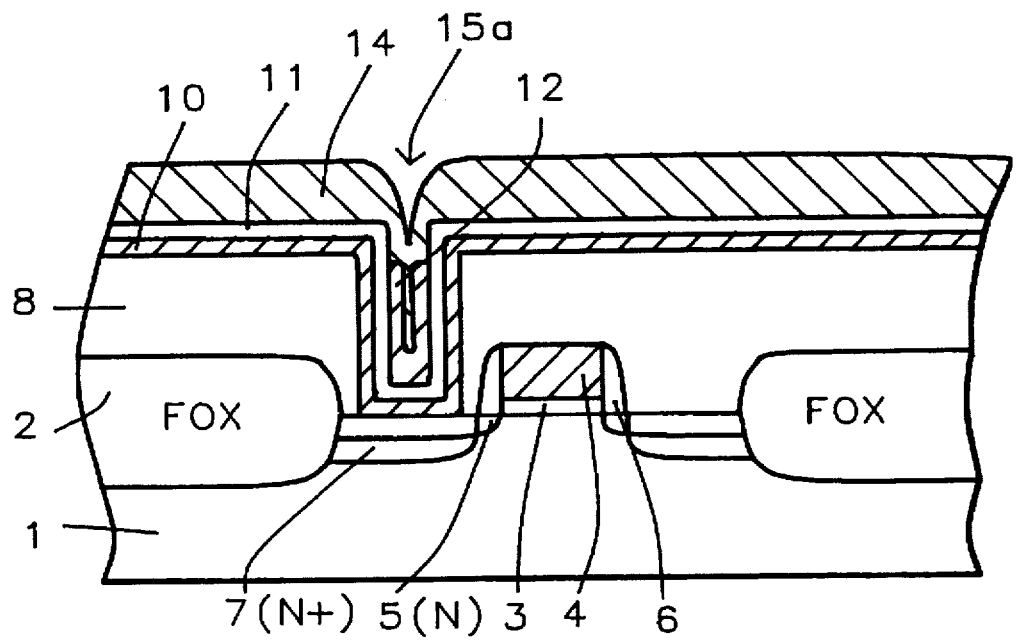
FIG. 4, which schematically, in cross-sectional form, shows the inability of an aluminum based metallization layer to conformally fill the enlarged seam in the tungsten fill.

The consequence of seam, 13a, is realized when a blanket, selective RIE procedure, using $SF_6$ as an etchant, is used to remove unwanted tungsten, 12, (while titanium nitride, 11, and titanium, 10, still remain on the surface of silicon oxide layer, 8), creating the tungsten plug in contact hole, 9. The exposed seam, 13a, is not only subjected to the RIE removal process, but also subjected to a RIE overetch step, used to insure complete removal of unwanted materials in areas where poor deposition uniformities may have existed. These RIE procedures result in the evolution of seam, 13a, to void, 13b, shown schematically in FIG. 3. An aluminum based, interconnect metallization layer, 14, containing between about 0.5 to 2.0% copper, and between about 0 to 1.0% silicon, is next deposited, using r.f. sputtering, to a thickness between about 3000 to 10000 Angstroms. The large void, 13b, in the tungsten fill, presents difficulties when attempting to deposit the overlying aluminum based metallization layer. The poor step coverage of the sputtered deposition, results in a thinner then desired aluminum layer, in area, 15a, shown schematically in FIG. 4. This thin aluminum based layer, in area, 15a, can result in electromigration failures, due to the higher then anticipated current densities that will be carried by aluminum based layers, in this thinned region.

Figure 5:
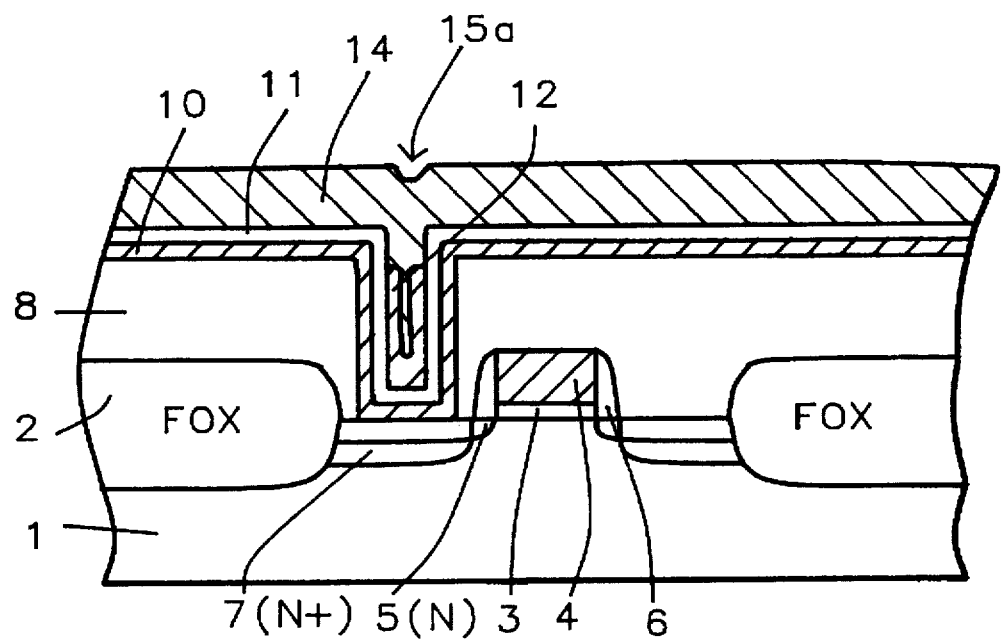
FIG. 5, which schematically, in cross-sectional form, shows an aluminum based metallization layer, subjected to a high pressure treatment, allowing for more conformal filling of the enlarged seam in the tungsten fill.
Figure 6:
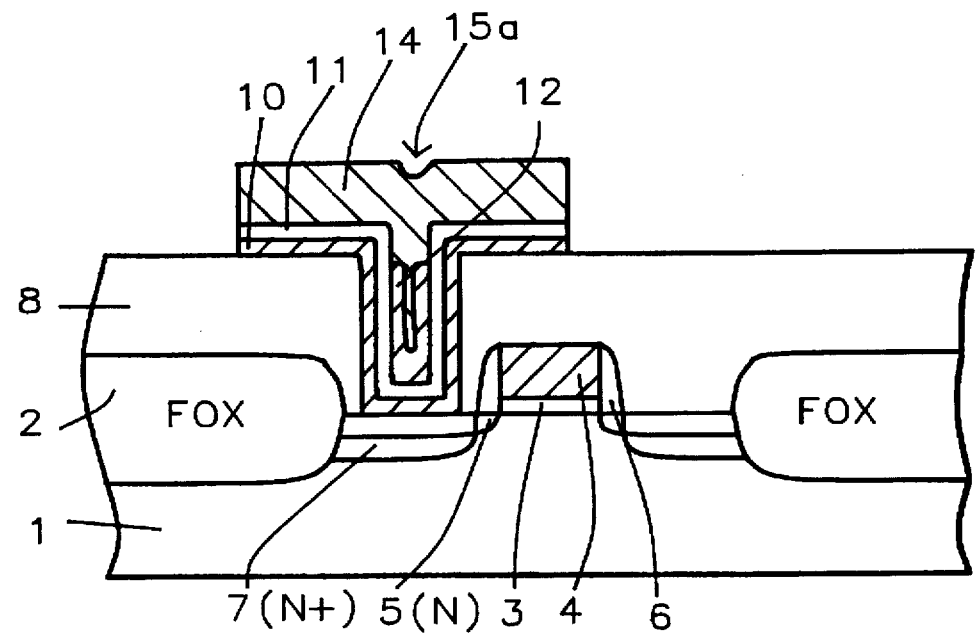
FIG. 6, which schematically, in cross-sectional form, represents the aluminum based, interconnect structure, overlying the tungsten filled contact hole.

A treatment designed to increase the coverage of the aluminum based metallization, in area, 15a, will now be described. A high pressure treatment, or an extrusion procedure, is performed to the soft, aluminum based metallization layer, 14. This treatment is performed in a high pressure chamber, in an argon ambient, at a temperature between about 400° to 500° C., and of greatest importance, at a pressure between about 30 to 120 Mega-pascal, (MPa). This procedure extrudes or forces aluminum into area, 15a, resulting in a thicker aluminum based metallization layer, in region 15a. The risk of electromigration failure for aluminum based metallization layer, 14, has now been decreased due to the formation of a thicker film in the vulnerable region, 15a, accomplished by the high pressure treatment. This is shown schematically in FIG. 5. Finally patterning to produce aluminum based, interconnect structure, 16, including the underlying titanium nitride barrier layer, 11, and underlying titanium adhesive layer, 10, is accomplished via conventional photolithographic and RIE procedures, using $CHF_3$ as an etchant. Photoresist removal is once again performed using oxygen plasma ashing, followed by careful wet cleans.

This process although shown for aluminum layers overlying tungsten filled contact holes, can also be applied to aluminum layers overlying tungsten filled via holes. In addition this process although shown as an application for an N channel, (NFET), device, can also be applied to P channel, (PFET), devices, complimentary, (CMOS), devices, as well as to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using an interconnect metallization structure overlying a metal filled contact hole, to provide a conductive path between underlying silicon device regions, in said semiconductor substrate, and overlying metallization structures, comprising:

providing said silicon device region, in said semiconductor substrate;

deposition of an insulator layer on said semiconductor substrate, including deposition on said silicon device region;

photolithographic processing to open a region in a photoresist layer, to expose a specific region of said insulator layer, directly overlying a specific area of said silicon device region;

anisotropic etching of said insulator layer, in opened region of said photoresist layer, to create said contact hole to said specific area, of said silicon device region;

removal of said photoresist layer;

surface cleaning of said specific area, of said silicon device region;

deposition of an adhesive layer on top surface of said insulator layer, on sides of said insulator layer, in said contact hole, and on said specific area, of said silicon device region;

deposition of a barrier layer on said adhesive layer;

deposition of a metal layer, on said barrier layer, filling said contact hole, and resulting in a seam in the center of said metal layer;

removal of said metal layer, from top surface of said barrier layer, outside said contact hole, forming a metal plug in said contact hole, and converting said seam, in center of said metal layer, to a first void, in the center of said metal layer;

deposition of an interconnect metallization layer on said metal plug, and on top surface of said barrier layer, resulting in the creation of a second void, in said interconnect metallization layer, overlying said first void, in center of said metal layer, and larger then said first void, in center of said first metal layer;

treatment of said interconnect metallization layer, to decrease the size of said second void, in said interconnect metallization layer, with said treatment performed at a pressure between about 30 to 120 mega-pascal at a temperature between about 400° and 500° C. in an argon ambient; and patterning of said interconnect metallization layer, said barrier layer, and said adhesive layer, to form interconnect metallization structure.

2. The method of claim 1, wherein said specific area, of said silicon device region, is a doped, N+ source and drain region, of said MOSFET device.

3. The method of claim 1, wherein said insulator layer is silicon oxide, deposited using either LPCVD, PECVD, or APCVD processing, at a temperature between about 400° and 800° C., to a thickness between about 5000 to 10000 Angstroms.

4. The method of claim 1, wherein said contact hole is formed via anisotropic, RIE processing, using $CHF_3$ as an etchant, and having an opening with a diameter between about 0.3 and 0.8 µM, resulting in an aspect ratio between about 1 and 3.

5. The method of claim 1, wherein said adhesive layer is titanium, deposited using r.f. sputtering, to a thickness between about 200 and 500 Angstroms.

6. The method of claim 1, wherein said barrier layer is titanium nitride, deposited using r.f. sputtering, to a thickness between about 500 and 1500 Angstroms.

7. The method of claim 1, wherein said metal layer is tungsten, deposited using LPCVD processing, at a temperature between about 300° and 500° C., to a thickness between about 2000 and 8000 Angstroms.

8. The method of claim 1, wherein removal of said metal layer, from top surface of said barrier layer, is performed via RIE processing, using $SF_6$ as an etchant.

9. The method of claim 1, wherein said interconnect metallization layer is aluminum, containing between about 0.5 and 2.0% copper, and between about 0 and 1.0% silicon, deposited via r.f. sputtering, to a thickness between about 3000 and 10000 Angstroms.

10. A method for fabricating a MOSFET device, on a semiconductor substrate, using an aluminum based, interconnect structure overlying a tungsten filled contact hole, to provide a conductive path between underlying silicon device regions, in said semiconductor substrate, and overlying metallization structures, comprising:

providing said silicon device region, in said semiconductor substrate;

deposition of an insulator layer on said semiconductor substrate, including deposition on said silicon device region;

photolithographic processing to open a region in a photoresist layer, to expose a specific region of said insulator layer, directly overlying a specific area of said silicon device region;

anisotropic etching of said insulator layer, in opened region of said photoresist layer, to create said contact hole to said specific area, of said silicon device region;

removal of said photoresist layer;

surface cleaning of said specific area, of said silicon device region;

deposition of a titanium layer on top surface of said insulator layer, on sides of said insulator layer, in said contact hole, and on said specific area, of said silicon device region;

deposition of a titanium nitride layer, on said titanium layer;

deposition of a tungsten layer, on said titanium nitride layer, completely filling said contact hole, resulting in a seam, in the center of said tungsten layer;

removal of said tungsten layer, from the top surface of said titanium nitride layer, outside the area of said contact hole, forming a tungsten plug in said contact hole, and converting said seam, in center of said tungtsen layer, to a first void, in the center of said tungsten layer;

deposition of an aluminum based metallization layer on said tungsten plug, and on top surface of said titanium nitride layer creating a second void, in said aluminum based metallization layer, overlying said first void, in center of said tungsten layer, and larger then said first void, in center of said tungsten layer;

treatment of said aluminum based metallization layer, to decrease the size of said second void, in said aluminum based metallization layer, and with said treatment performed at a pressure between about 30 to 120 megapascal at a temperature between about 400° and 500° C., in an argon ambient, and patterning of said aluminum based metallization layer, of said titanium nitride layer, and of said titanium layer, to form said aluminum based interconnect structure.

11. The method of claim 10, wherein said specific area, of said silicon device region, is a doped, N+ source and drain region, of said MOSFET device.

12. The method of claim 10, wherein said insulator layer is silicon oxide, deposited using either LPCVD, PECVD, or APCVD processing, at a temperature between about 400° and 800° C., to a thickness between about 5000 and 10000 Angstroms.

13. The method of claim 10, wherein said contact hole is formed via anisotropic RIE processing, using $CHF_3$ as an etchant, and having an opening with a diameter between about 0.3 and 0.8 µM, resulting in an aspect ratio between about 1 and 3.

14. The method of claim 10, wherein said titanium layer is deposited using r.f. sputtering, to a thickness between about 200 and 500 Angstroms.

15. The method of claim 10, wherein said titanium nitride layer is deposited using r.f. sputtering, to a thickness between about 500 and 1500 Angstroms.

16. The method of claim 10, wherein said tungsten layer is deposited using LPCVD processing, at a temperature between about 300° and 500° C., to a thickness between about 2000 and 8000 Angstroms.

17. The method of claim 10, wherein removal of said tungsten layer, from top surface of said titanium nitride layer, is performed via RIE processing, using $SF_6$ as an etchant.

18. The method of claim 10, wherein said aluminum based metallization layer, containing between about 0.5 and 2.0% copper, and between about 0 and 1.0% silicon, is deposited using r.f. sputtering, to a thickness between about 3000 and 10000 Angstroms.

* * * * *